(12) United States Patent
Loh et al.

(10) Patent No.: US 8,153,527 B2
(45) Date of Patent: Apr. 10, 2012

(54) METHOD FOR REDUCING SIDEWALL ETCH RESIDUE

(75) Inventors: Soon Yoong Loh, Masai (MY); Carol Goh, Singapore (SG); Kin Wai Tang, Singapore (SG); Kim Foong Kong, Singapore (SG)

(73) Assignee: Globalfoundries Singapore Pte. Ltd., Singapore (SG)

( * ) Notice: Subject to any disclaimer, the term of this patent is extended or adjusted under 35 U.S.C. 154(b) by 47 days.

(21) Appl. No.: 12/249,970

(22) Filed: Oct. 13, 2008

(65) Prior Publication Data

US 2010/0091424 A1    Apr. 15, 2010

(51) Int. Cl.
*H01L 21/311* (2006.01)

(52) U.S. Cl. ........ 438/695; 438/694; 438/906; 438/240; 438/239; 438/253; 257/E21.224; 257/E21.226; 257/E21.011

(58) Field of Classification Search .................. 438/270, 438/239, 253, 695, 694, 906, 240; 257/E21.011, 257/E21.02, E21.224, E21.226
See application file for complete search history.

(56) References Cited

U.S. PATENT DOCUMENTS

| | | | | |
|---|---|---|---|---|
| 6,097,051 A * | 8/2000 | Torii et al. | ...................... | 257/306 |
| 6,271,115 B1 * | 8/2001 | Liu et al. | ........................ | 438/618 |
| 6,630,380 B1 * | 10/2003 | Cheng et al. | .................. | 438/253 |
| 2003/0181055 A1 | 9/2003 | Wu et al. | | |
| 2004/0185678 A1 * | 9/2004 | Lee et al. | ........................ | 438/780 |
| 2005/0056878 A1 * | 3/2005 | Shioga et al. | ................. | 257/300 |
| 2008/0121956 A1 * | 5/2008 | Kanaya | ......................... | 257/295 |

FOREIGN PATENT DOCUMENTS

| | | |
|---|---|---|
| KR | 100291551 | 3/2001 |
| KR | 100291552 | 3/2001 |
| KR | 20030001873 | 1/2003 |

* cited by examiner

*Primary Examiner* — Julio J Maldonado
*Assistant Examiner* — Maria Ligai
(74) *Attorney, Agent, or Firm* — Horizon IP Pte Ltd

(57) ABSTRACT

A method for fabricating a semiconductor device is provided. The method comprising forming a first layer over a substrate and a second layer over the first layer. A patterned masking layer is subsequently provided over the second layer and a patterned second layer with outwardly tapered sidewalls is formed by isotropically etching exposed portions of the second layer. A patterned first layer is the formed by etching the first layer in accordance with the patterned second layer.

18 Claims, 12 Drawing Sheets

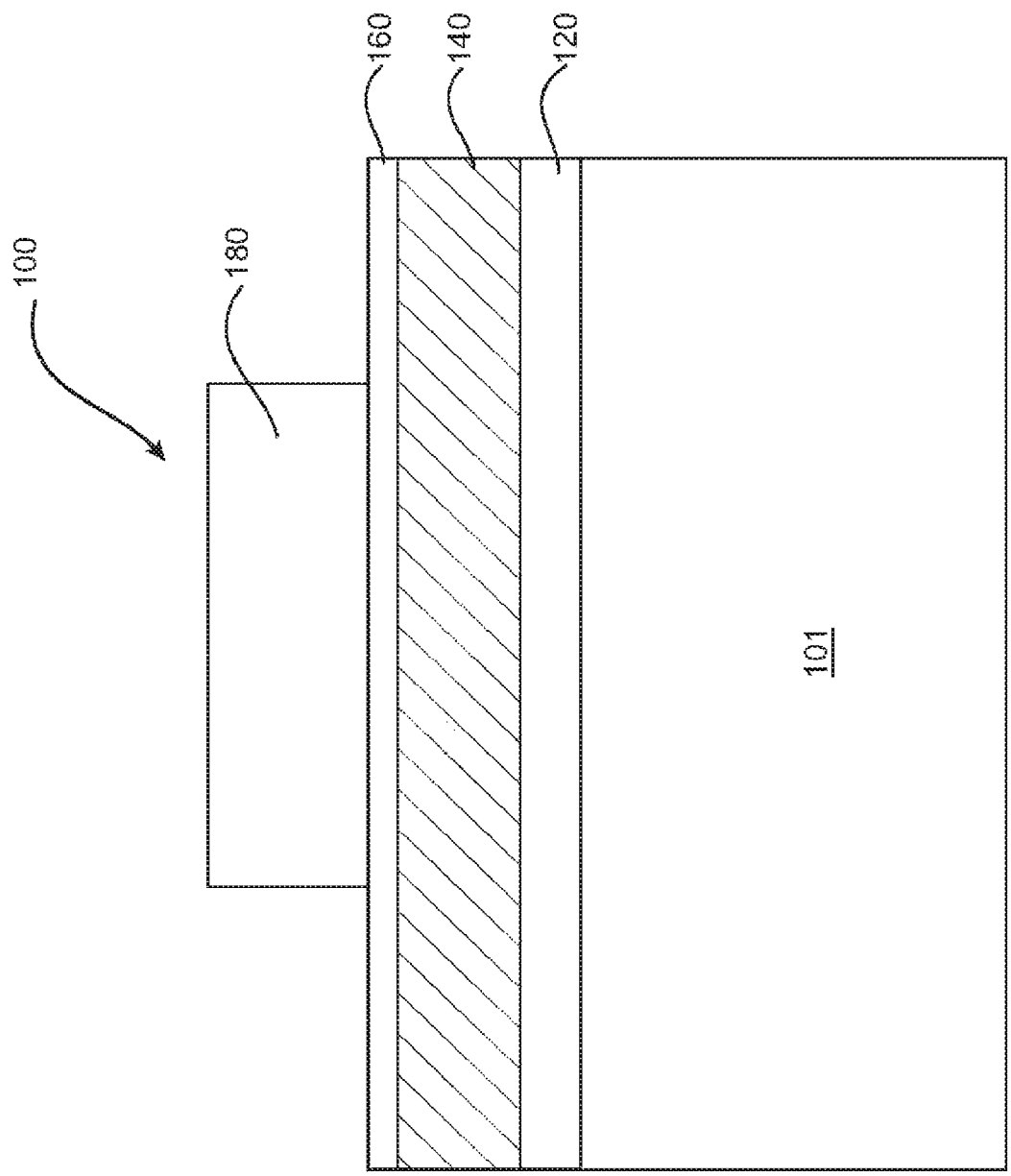

METHOD FOR REDUCING SIDEWALL ETCH RESIDUE

FIELD OF THE INVENTION

The present invention relates in general to semiconductor devices and in particular, to the fabrication of semiconductor devices and methods for reducing the extent of sidewall etch residue remaining post etch.

BACKGROUND OF THE INVENTION

Integrated circuits can be found in many of today's consumer electronics such as cell phones, video camera, portable music players, computers, printers, etc. Integrated circuits may comprise a combination of various active and passive semiconductor devices and their interconnections. The formation of these semiconductor devices and interconnections typically include patterning steps where a mask (such as a photoresist mask) is formed over one or more layers on a substrate and exposed portions of the layers underlying the mask selectively removed. In this manner, the desired design and layout for an integrated circuit can be transferred onto a semiconductor wafer.

FIGS. 1A to 1C illustrate a known method for patterning semiconductor devices 100. In FIG. 1A, a first dielectric layer 120, a first metallic layer 140 and a second dielectric layer 160 are deposited over a substrate 101. The first dielectric layer 120 being the lowermost layer in the stack and the second dielectric layer 160 being the uppermost layer in the stack. A photoresist layer is deposited over the second dielectric layer 160 and then developed to form a patterned photoresist mask 180. The second dielectric layer 160 and the first metallic layer 140 are subsequently etched in accordance with the photoresist mask 180 using a plasma etching process.

During the etching of the second dielectric 160 and first metallic layer 140, etch residues 190 are formed along the sidewalls of the photoresist mask 180, second dielectric layer 160 and first metallic layer 140 as shown in FIG. 1B. These sidewall etch residues are a by-product of the plasma etching process and may include hardened photoresist material, etch residue generated as a result of chemical reactions occurring during the plasma etch, sputtered on materials, or re-deposited materials or combinations thereof. In this example, the sidewall etch residues 190 are conductive since the first layer is made of metallic material 140.

FIG. 1C shows the semiconductor structure 100 of FIG. 1B after etching has completed and the photoresist mask 180 is removed by a plasma based photoresist strip process. The plasma based photoresist strip process is typically followed by a wet etch process to remove the sidewall etch residue 190. Commercially available chemical strippers such as CR solution (which comprises sulphuric acid and hydrogen peroxide), HF or NE 111 (from Air Products) may be used in the wet etch process. Depending on factors such as the materials being etched and/or process conditions for the plasma dry etch, the sidewall etch residues 190 may still remain after the wet etch process for instance as illustrated in FIG. 1C. The residual sidewall etch residues 190 are undesirable and can result in problems such as device failure, current leakage and degradation of device reliability.

FIG. 2 shows a conventional metal-insulator-metal (MIM) capacitor 200. MIM capacitors are semiconductor devices formed by sandwiching one or more layers of dielectric material between a top and a bottom conductive electrode. The electrodes often include metal layers or alloys thereof. The metal layers or alloys can comprise some or all of top and/or bottom electrodes of the capacitor. In FIG. 2, the MIM capacitor 200 is formed on a dielectric layer 210 over a substrate 201 and comprises metallic bottom and top electrodes (220, 240) separated by a capacitor dielectric layer 230. The top electrode 240 is smaller than the bottom electrode 220, creating an area for via contacts 250 to the bottom electrode 220. Via contacts 260 are also provided for electrical connection to the top electrode 240.

The MIM capacitor of FIG. 2 is formed by patterning the top and bottom electrodes (220, 240) using the method described in relation to FIGS. 1A to 1C. During the etching of the bottom and top electrodes, conductive etch residues 280 are formed along the sidewalls of the capacitor. In this illustrated example, wet clean processes carried out post top and bottom electrode plasma etch are not able to remove the sidewall etch residues 280 effectively. Consequently, the sidewall etch residues 280 protrude above the level of bottom and top electrodes (220, 240) shorting with an adjacent via contact (250, 260). Since the polymer fences 280 are conductive, such a phenomena is undesirable as it results in problems such as current leakage and degradation of device reliability. A possible solution is to use a more aggressive chemical stripper to improve etch residue removal but this has the problem of damaging the capacitor dielectric 230 which in turn leads to degradation of capacitor performance.

In view of the foregoing discussion, it is desirable to provide a method for reducing the extent of etch residue remaining post etch while minimizing damage to the semiconductor device.

SUMMARY OF THE INVENTION

The present invention relates to semiconductor devices and methods for reducing the extent of sidewall etch residue during the fabrication of semiconductor devices.

In one aspect of the invention, a method for fabricating a semiconductor device is provided. The method comprises forming a first layer over a substrate and a second layer over the first layer. A patterned masking layer is formed over the second layer and a patterned second layer with outwardly tapered sidewalls formed by isotropically etching exposed portions of the second layer. The first layer is subsequently etched in accordance with the patterned second layer to form a patterned first layer.

In another aspect of the invention, a capacitor structure is disclosed. The capacitor comprises a first electrode and a first layer overlying the first electrode. The first layer has outwardly tapered sidewalls and acts as a capacitor dielectric or a diffusion barrier layer for the capacitor.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 1A-1C are schematic cross-sectional views illustrating a known method for patterning semiconductor devices;

DETAILED DESCRIPTION OF THE INVENTION

Figure 1B:
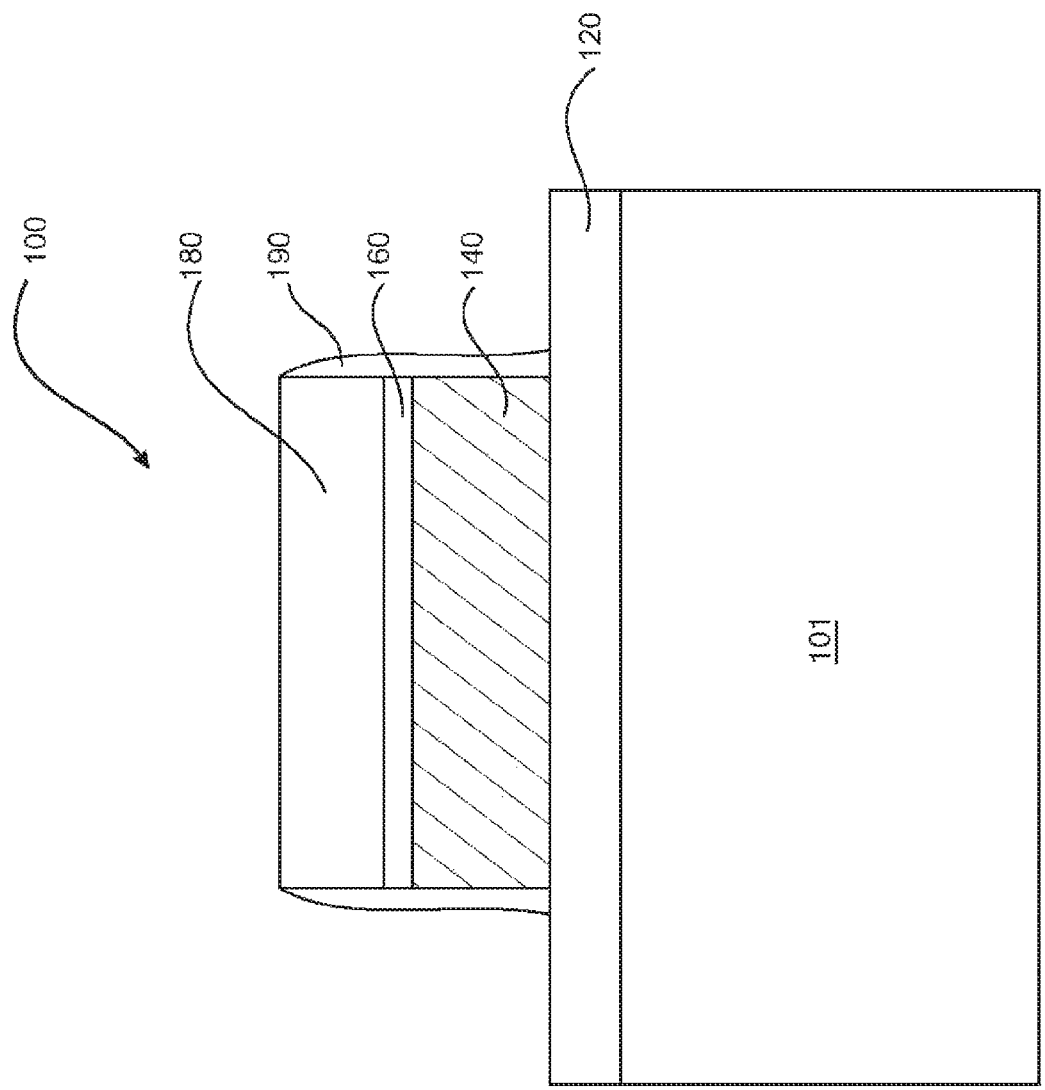
Figure 1C:
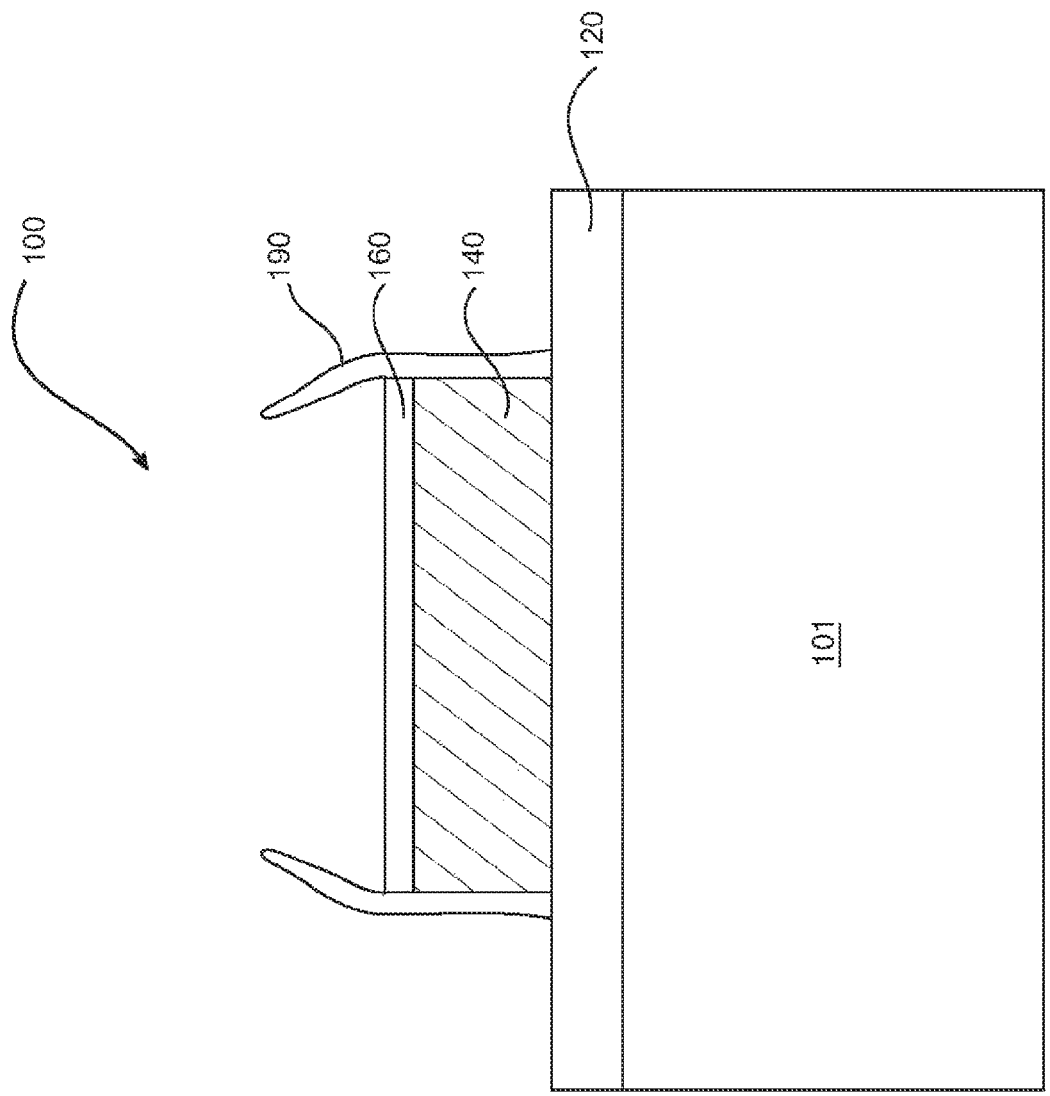

One or more aspects of the present invention will now be described with reference to the attached figures, wherein like reference numerals are used to refer to like elements throughout, and wherein the various structures are not necessarily drawn to scale.

The present invention relates to the methods of fabricating semiconductor devices in a manner that reduces the amount of etch residue remaining post etch. In general terms, a first layer is formed over a substrate followed by a second overlying layer. The second layer is isotropically etched to form a patterned second layer with outwardly tapered sidewalls and the first layer is subsequently etched in accordance with the second layer. During the etching of the first layer, etch residues are formed along the sidewalls of the first and second layer. The outwardly tapered sidewalls of the second layer may be inclined at an angle such that etch residues formed thereon can be dislodged more efficiently by physical bombardment, thus reducing the amount of etch residues present post etch. In addition, the inventors have also discovered that it is easier to control and obtain the desired second layer sidewall angle through isotropic etch of a material as compared to for example, using a photoresist material as a mask and reflowing its sidewalls to obtain tapered sidewalls inclined at a desired angle. The sidewall angles obtained through etching are also more repeatable between wafers compared to a photoresist reflow process.

FIGS. 3-8, which follow, depict by way of example and not by limitation, one or more exemplary methods for patterning a top electrode of a MIM capacitor. It is to be understood that the MIM capacitor presented in these figures merely represent one example or illustration of how concepts of the present invention may be applied. There is no intention to limit the application of the present invention to MIM capacitors or the patterning of top electrodes. The invention is also relevant to the patterning of other features on a semiconductor device such as but not limited to polysilicon lines, metal gates and bottom electrodes in a MIM capacitor.

Additionally, it is also to be appreciated that a plurality of conventional processes that are well known in the art and not repeated herein, may precede or follow FIGS. 3-8. Moreover, it is to be understood that many modifications, additions, and/or omissions may be made to the below described process without departing from the scope or spirit of the claimed subject matter. For example, the below described process may include fewer, or more steps. Also, it is to be appreciated that the present disclosure need not be limited to the initial semiconductor device structure depicted by FIG. 3.

Figure 3:
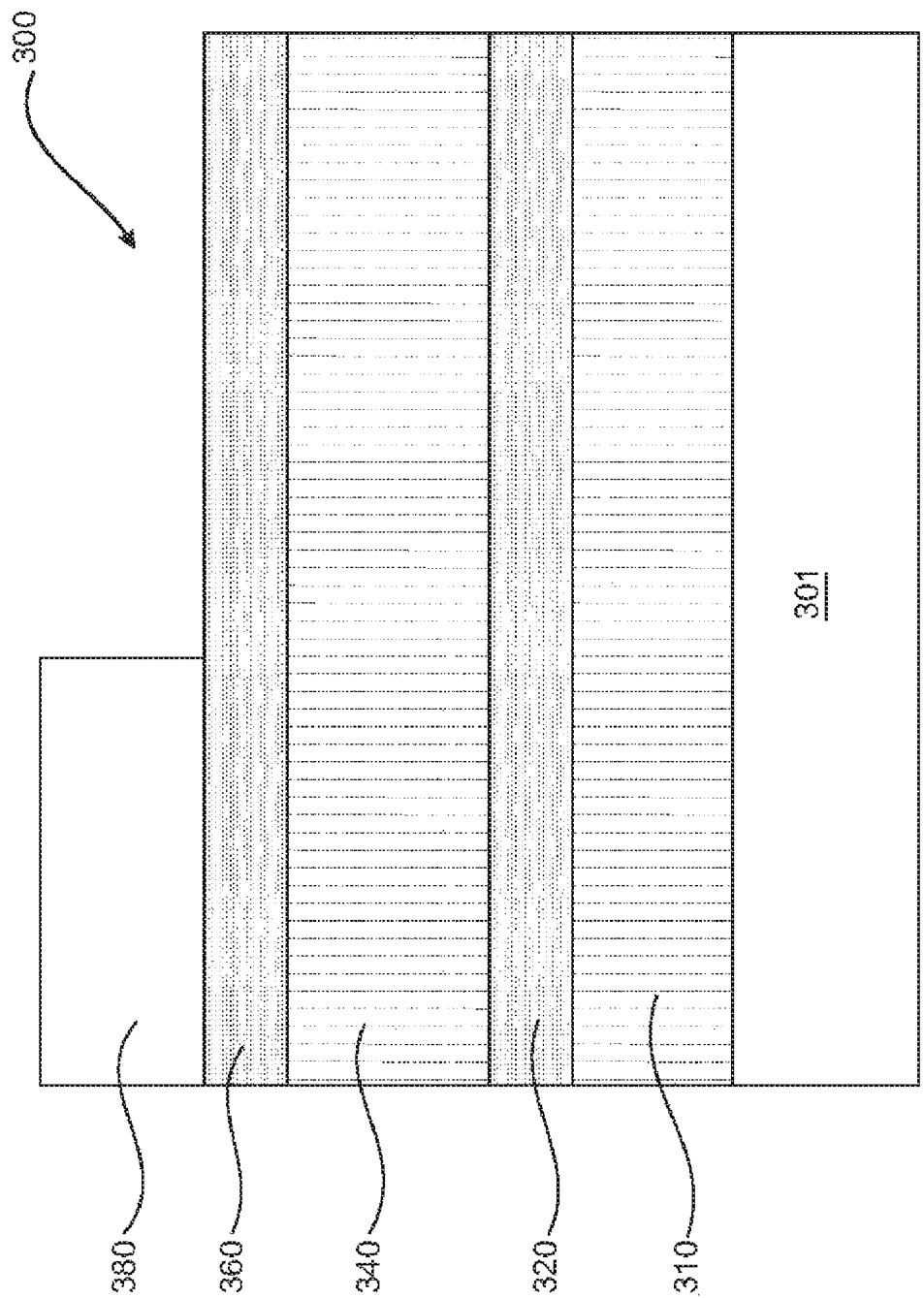
FIGS. 3-9 are schematic cross-sectional views illustrating progressive steps in a process for fabricating a MIM capacitor in accordance with one embodiment of the invention.

FIG. 3 shows a semiconductor structure 300 comprising a substrate 301 and a MIM capacitor stack comprising a bottom electrode layer 310, a capacitor dielectric layer 320 and a top electrode layer 340 sequentially deposited over the substrate 301. A top dielectric layer 360 is subsequently formed on top of the foregoing layers that form the MIM capacitor. In one embodiment, the top dielectric layer 360 comprises silicon nitride. Alternatively, other dielectric materials such as but not limited to silicon oxide, silicon oxynitride, bottom anti-reflective coating (BARC) material may also be used and/or the top dielectric layer may also be made up of multiple layers. The top dielectric layer 360 may serve as a hard mask layer during the etching of underlying layers and/or a diffusion barrier for the top electrode layer 340.

A photoresist layer is deposited on the entire surface of the top dielectric layer 360 and selectively exposed and developed to form a masking layer 380 for patterning the top dielectric layer and optionally other underlying layers such as the top electrode layer 340.

In the presently described embodiment, the top electrode layer 340 comprises tantalum. Alternatively, other conductive material suitable for use as an electrode layer such as but not limited to Titanium nitride (TiN), Tantalum nitride (TaN), Aluminum, Tungsten, Copper, Platinum (Pt), alloys thereof or combinations thereof are also suitable. The top electrode layer may be formed by various techniques, such as atomic layer deposition (ALD), chemical vapor deposition (CVD), electroplating or physical vapor deposition (PVD). Other techniques may also be useful.

The bottom electrode layer 310 may comprise conductive materials that are the same or different from those used for the top electrode layer 340. As for the capacitor dielectric layer 340, it may comprise nitrided oxide, oxynitride, oxide/nitride/oxide (ONO), silicon oxide, high dielectric constant materials such as barium-strontium-titanium oxide, strontium-bismuth-tantalum oxide, $Ta_2O_5$ or a combination of the above. Alternatively, other materials that are suitable as a capacitor dielectric are also useful. The capacitor dielectric layer may be deposited using various conventional techniques, such as CVD, PVD, ALD or a combination thereof.

Apart from possible variations in the materials used for the above described components of the MIM capacitor stack, it is to be appreciated that the MIM capacitor stack may also comprise additional layers not illustrated in FIG. 3. For example, the MIM capacitor stack may include one or more barrier layers sandwiched between the electrode layers and the capacitor dielectric layer, one or more barrier layers above the top and/or bottom electrode layer (340, 310), or combinations thereof.

The substrate 301 is conventional in the semiconductor fabrication art and may comprise a silicon substrate. Other types of semiconductor substrates, such as silicon-on-insulator, (SOI), SiC, germanium-based including SiGe, SiGeC, and SiGe-on-insulators (SGOIs), or gallium arsenide, are also useful. It is to be appreciated that various semiconductor devices (not illustrated) can be formed in or on the semiconductor substrate 301. These devices, for example, can include transistors, contact regions, resistors and trench capacitors.

Figure 4:
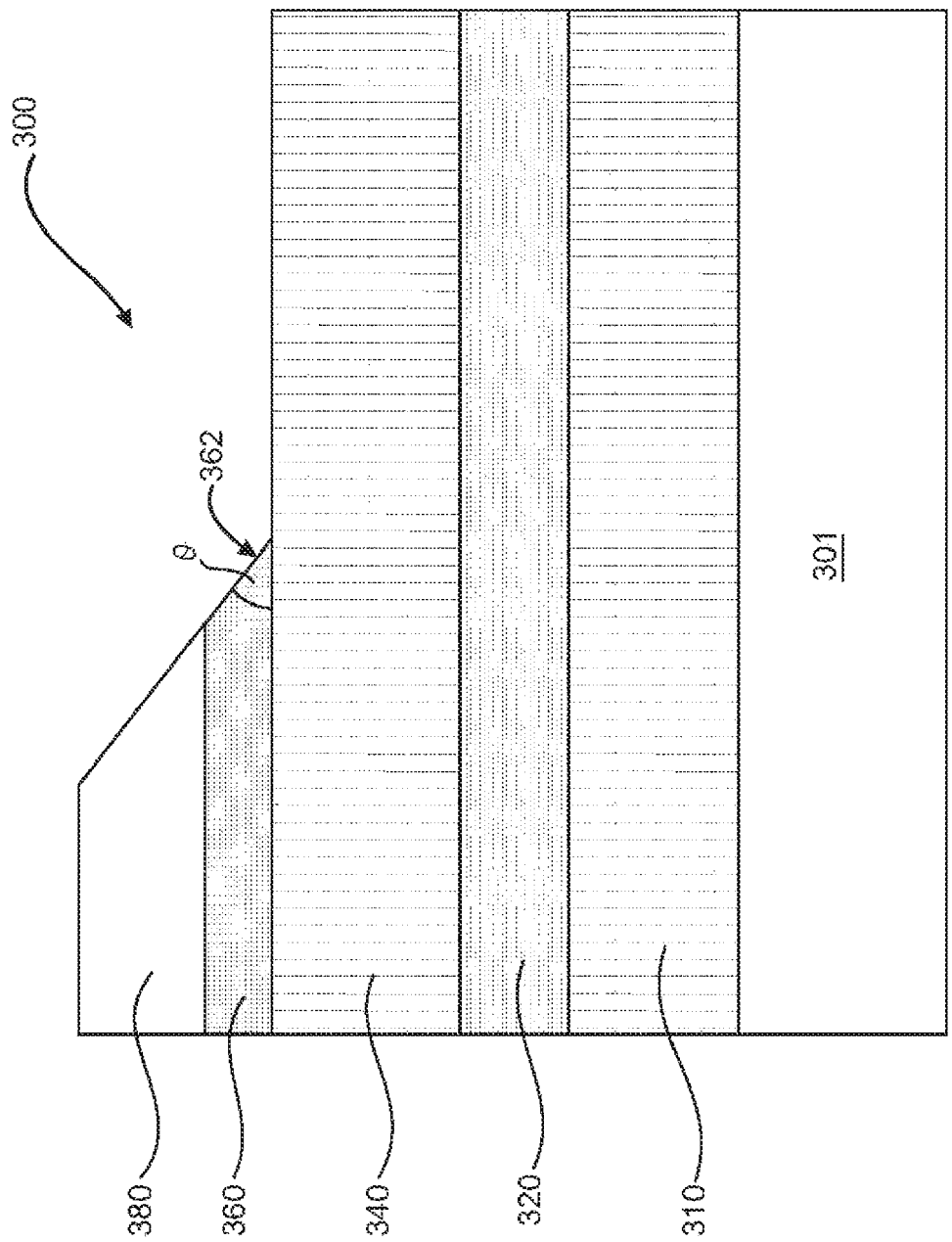

FIG. 4 shows the semiconductor structure 300 of FIG. 3 after an isotropic etch is applied to pattern the top dielectric layer 360 by removing exposed portions thereof. An isotropic etch is one that removes exposed portions of the top dielectric layer 360 in both a lateral and vertical manner thus providing a patterned top dielectric layer 360 with sidewalls that are tapering outwards. As will be explained further in the succeeding paragraphs, etch residues are formed on the sidewalls of the patterned top dielectric layer as a by-product of subsequent etch steps. The outwardly tapered patterned top dielectric layer sidewalls when tilted at an appropriate angle provide a larger surface area that facilitates the trimming and hence reduction of these sidewall etch residue. The tapered sidewalls 362 in FIG. 4 are in contrast with known methods whereby the respective sidewalls of the patterned top dielectric layer 360 and the masking layer 380 are substantially flush after etch. Although not illustrated in FIG. 4, it is understood that etch residues may also be formed along the sidewalls of the top dielectric layer 360 and masking layer 380 as a by-product of the top dielectric layer etch.

In one embodiment, the sidewalls 362 of the patterned top dielectric layer 360 are tapered outwards and inclined at an angle θ, of less than 80 degrees to the top surface of the underlying top electrode layer 340. Preferably, the sidewalls of the patterned top dielectric 360 are inclined at an angle of approximately 40 to 60 degrees to the top surface of the underlying top electrode layer 340. The angle of incline may be adjusted by varying process conditions for the top dielectric layer etch such as bottom bias power.

Figure 2:
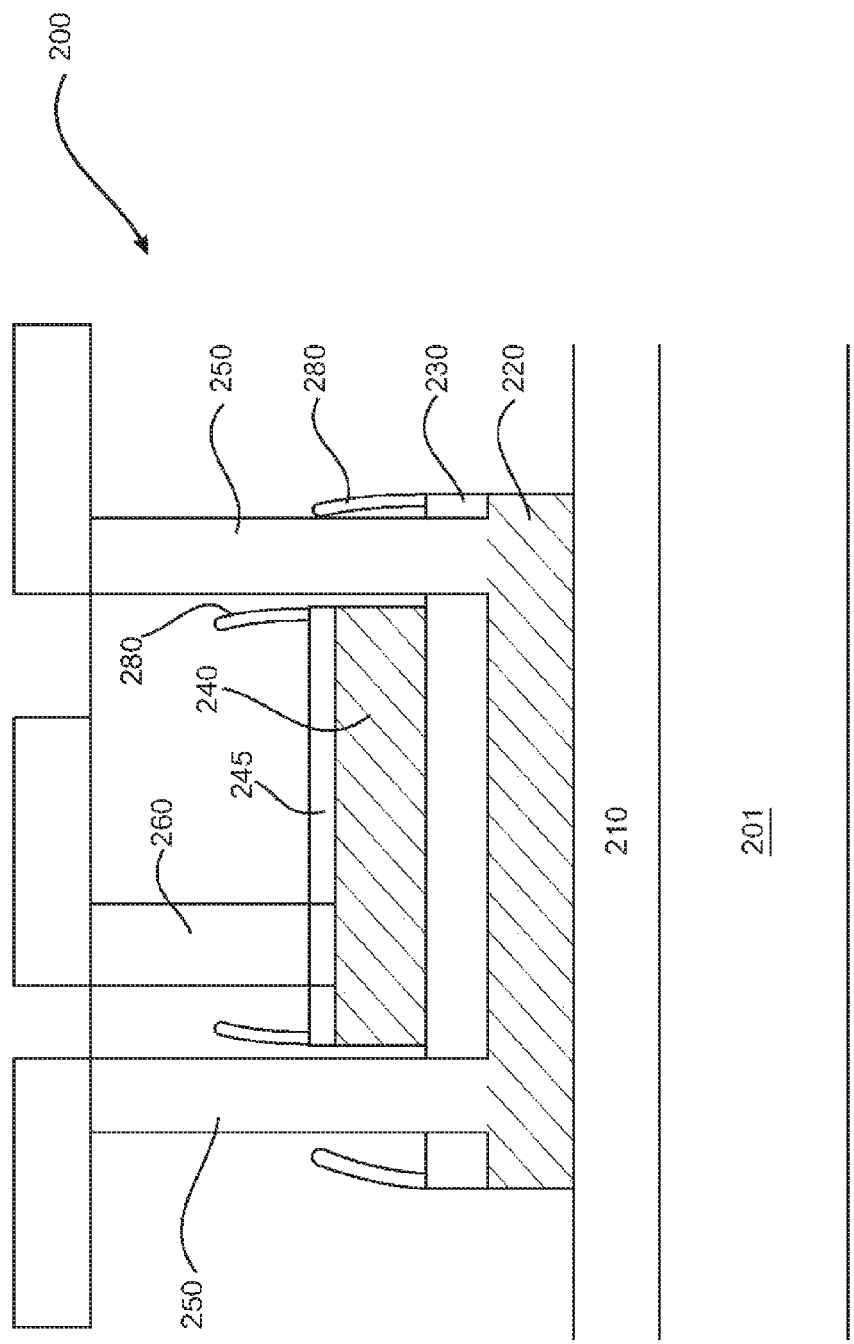
FIG. 2 is a schematic cross-sectional view of a MIM capacitor formed by the conventional processes described in relation to FIGS. 1A-1C.
Figure 5:
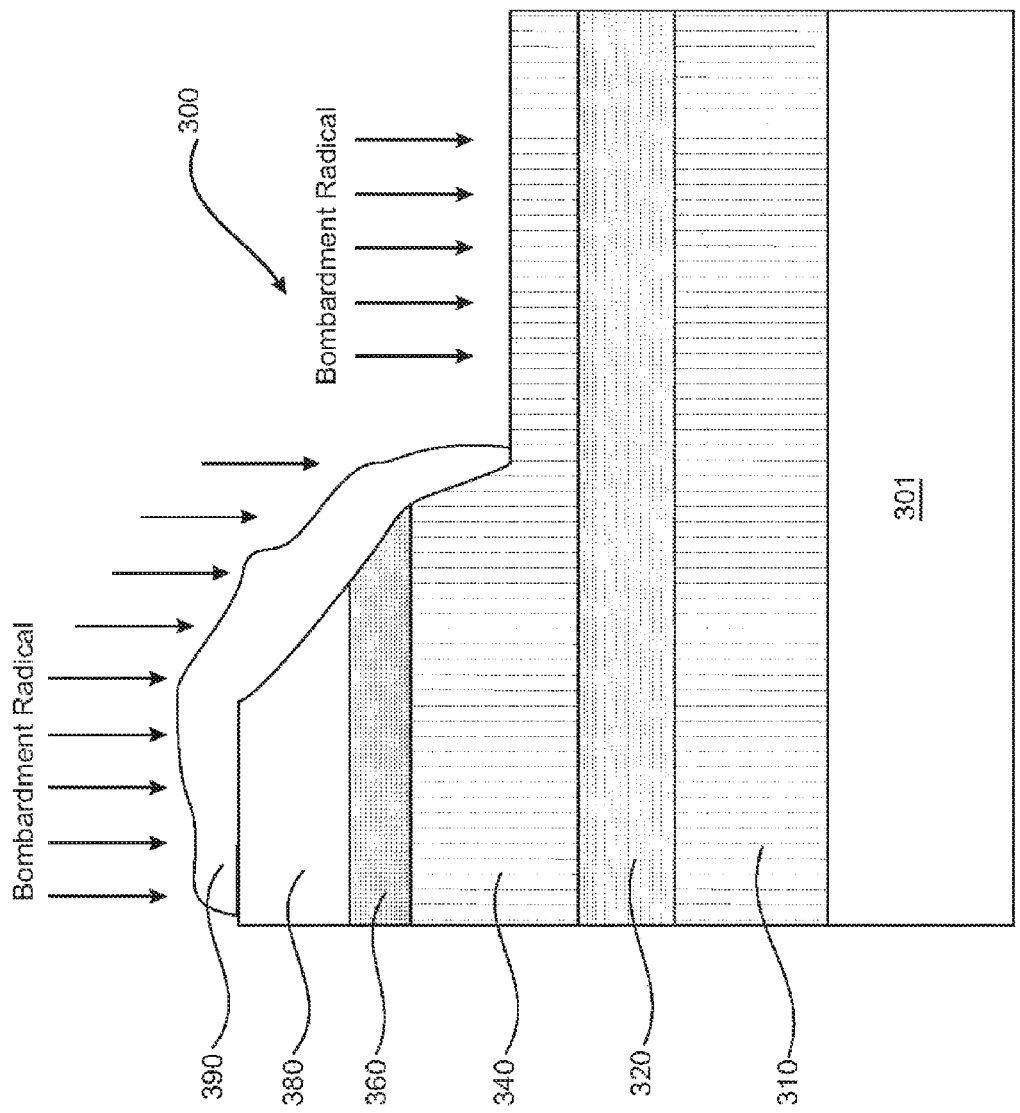

In FIG. 5, the top electrode layer 340 is patterned in accordance with the patterned top dielectric layer 360 using an anisotropic main etch process to remove exposed portions of the top electrode layer 340. As shown in FIG. 5, the top electrode etch forms etch residues 390 on the sidewalls of the masking layer 380, top dielectric film 360 and etched portions of the top electrode layer 340. Since the top electrode layer is comprised of a conductive material, the sidewall etch residues 390 are conductive in nature. Consequently, problems such as shorting with a neighboring via as previously illustrated in FIG. 2 may occur if extensive sidewall residues 390 remain post-etch.

In order to address potential problems associated with the presence of sidewall etch residue, the top electrode main etch process is configured to simultaneously remove exposed portions of the top electrode layer 340 and at the same time trim the sidewall etch residues 390 by physical bombardment. The physical bombardment dislodges etch residue 390 from the sidewall 362 of the top dielectric layer 360. Additionally, the sidewalls 362 of the patterned top dielectric layer are also inclined at an angle that would facilitate the trimming.

For the embodiment shown in FIG. 5, the etching recipe for the top electrode layer 340 is anisotropic and may comprise a first gas chemistry for etching the top electrode layer 340 coupled with some type of bombardment efficient gas chemistry for sputtering the sidewall etch residues 390. Since the etch process is anisotropic, the bombarding species travel in a vertically downward direction and thereby trimming of the sidewall etch residue in a substantially uni-directional manner. In a preferred embodiment, the ratio of sidewall etch residue removal rate to top electrode etch rate is 1:12~17.

In general, trimming efficiency improves as the energy of the bombarding species increases. Therefore, in order to achieve efficient etch residue removal, a high bottom bias power is applied so as to increase the impact energy of the bombarding species. In one embodiment, the bottom bias power is between 100 to 400 W. However, the invention is not limited as such and other bias values that provide high energy bombardment are also suitable.

As shown from FIG. 5, the bombarding radicals are able to impinge upon a larger surface area of the etch residues 390 as the top dielectric sidewalls are tapered outwards at an appropriate angle. Consequently, efficient trimming of the sidewall etch residues can be achieved. In one embodiment, the sidewalls 362 of the patterned top dielectric layer 360 are inclined at an angle of less than 80 degrees to the top surface of the underlying top electrode layer 340. Preferably, the sidewalls of the patterned top dielectric 360 are inclined at an angle of approximately 40 to 60 degrees to the top surface of the underlying top electrode layer 340. Although the surface area available for bombardment and hence trimming efficiency may improve with a smaller sidewall angle, the potential problem of punching through the top dielectric layer 360 may also limit the minimum usable angle.

In the presently described embodiment, the top electrode layer 340 comprises Tantalum. In one embodiment, an anisotopic plasma etch recipe comprising a fluorine containing chemistry (e.g. $CF_4$, $NF_3$, or combinations thereof) and/or a chlorine containing chemistry (e.g. $Cl_2$, $BCl_3$, or combinations thereof) is used to etch the Ta top electrode layer 340. The flow rate for the respective chemistry may be between 10 to 300 sccm. Alternatively, other combinations of gases that differentially etches the Ta electrode 340 while minimally etching other exposed materials such as the top dielectric layer 360 may also be suitable. In addition to the first gas chemistry for etching exposed Ta material, the plasma etch recipe also comprises a bombardment efficient gas chemistry to facilitate the trimming of etch residue residing on the sidewalls of the top dielectric layer. The bombardment efficient chemistry may comprise gases such as but not limited to Ar, $BCl_3$, $C_2H_4$, $N_2$, or combinations thereof. However, it is to be understood that the type of gas chemistry chosen in a second layer etch recipe is not limited to the above examples and may vary depending factors such as the type of material being etched and process conditions for the etch recipe (e.g. pressure, temperature, power etc.) while still achieving the desired objectives.

In an alternative embodiment, the masking layer 380 may be removed (for example, by an oxygen containing plasma process) after patterning the top dielectric layer 360. The patterned top dielectric layer 360 would therefore be used as an etch mask for patterning the underlying top electrode layer.

Figure 6:
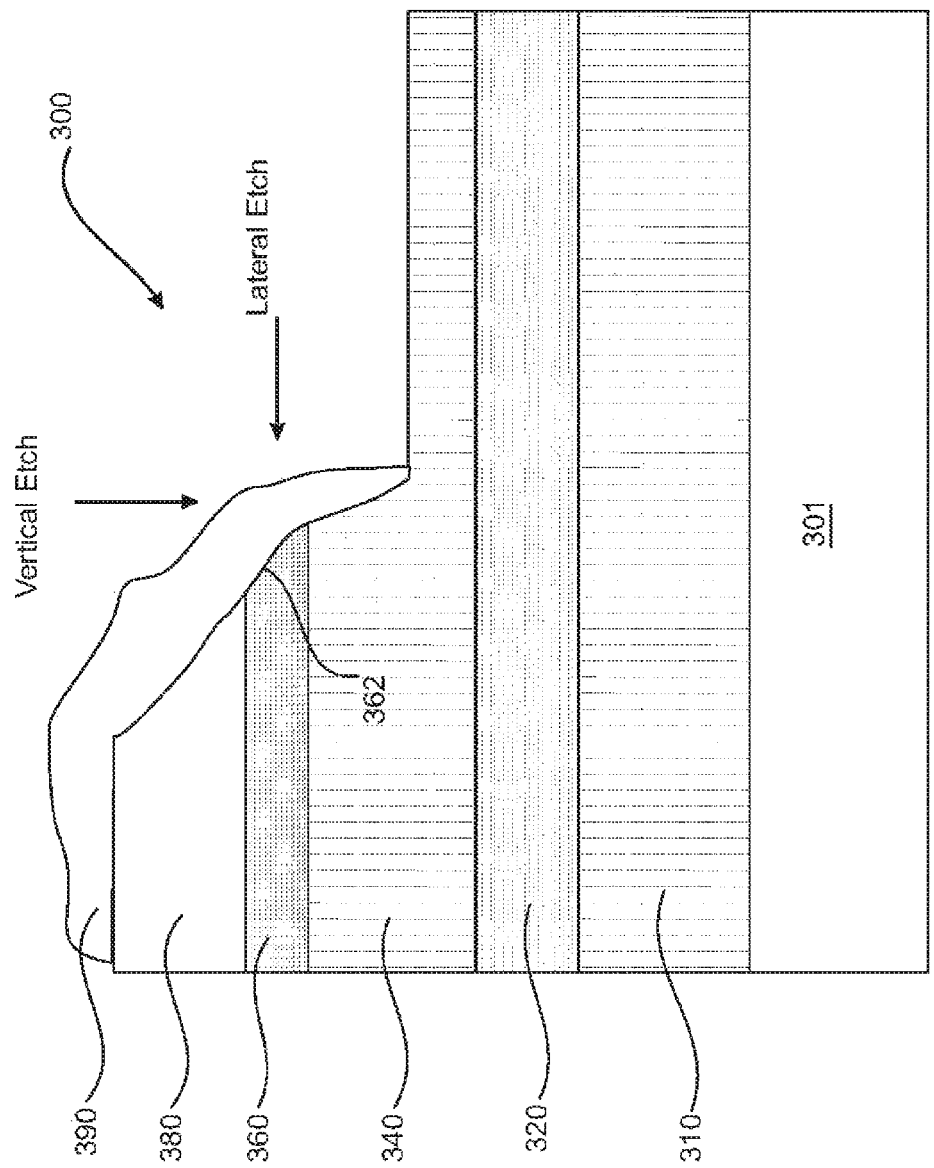

In an alternative embodiment (shown in FIG. 6), an isotropic main etch process is used to simultaneously etch the top electrode layer 340 in accordance with the patterned top dielectric layer 360 and trim the sidewall etch residues 390. Unlike the anisotopic etch embodiment described in relation to FIG. 5, an isotropic etch process is non-directional. Therefore, trimming of the sidewall etch residues 390 is not substantially uni-directional like FIG. 5 but rather the etch residues are dislodged by radicals approaching the sidewalls in many directions. For purposes of illustration only the vertical and horizontal etch components are shown in FIG. 6. In a preferred embodiment, the ratio of sidewall etch residue removal rate to top electrode etch rate is 1:12~17.

Preferably, the gases used for chemically etching the top electrode layer 340 are also responsible for trimming the sidewall residues. Therefore, unlike the anisotropic embodiment illustrated in FIG. 5, the etch recipe does not include a bombardment efficient gas provided specifically for sputtering the sidewall etch residues.

In the presently described embodiment, the top electrode layer 340 comprises Tantalum. In one embodiment, an isotropic plasma etch recipe comprising a fluorine containing chemistry (e.g. $CF_4$, $NF_3$, or combinations thereof) and/or a chlorine containing chemistry (e.g. $Cl_2$, $BCl_3$, or combinations thereof) may be used to etch the Ta top electrode layer 340. Alternatively, other chemistries may also be suitable. In order to sustain an isotropic plasma process, a low bottom bias power is used. For example the bottom bias power may be between 0 to 100 W. In general, an etch process tends to be more isotropic as the bottom bias power is decreased, that is, the extent of lateral etch increases with a reduction in bottom bias power. However, it is to be recognized that the type of gas chemistry chosen in a second layer etch recipe is not limited to the above examples and may vary depending on the type of material being etched and process conditions for the etch recipe e.g. pressure, temperature, power etc. while still achieving the desired objectives.

Figure 7:
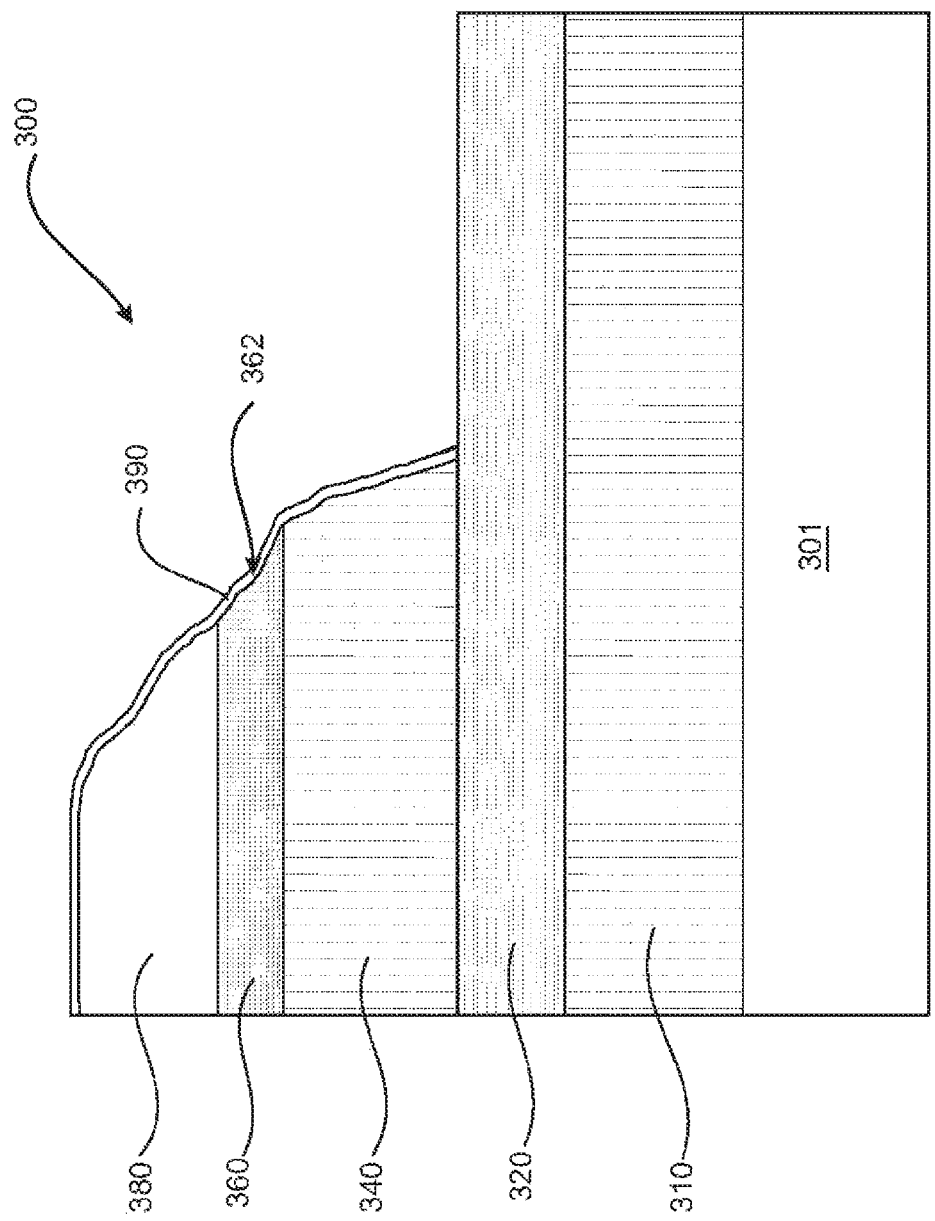

FIG. 7 shows the semiconductor structure 300 of FIG. 5 or FIG. 6 after the top electrode layer 340 has been etched through to form a patterned top electrode layer 340. There is some etch residue 390 present on the sidewalls of the patterned top dielectric layer and patterned top electrode layer 340 but the extent of it is reduced compared to processes where the top dielectric sidewalls are not tapered in a manner to facilitate etch residue trimming. Additionally, the extent of etch residue is also reduced by the provision of a trimming component in the top electrode main etch.

Figure 8:
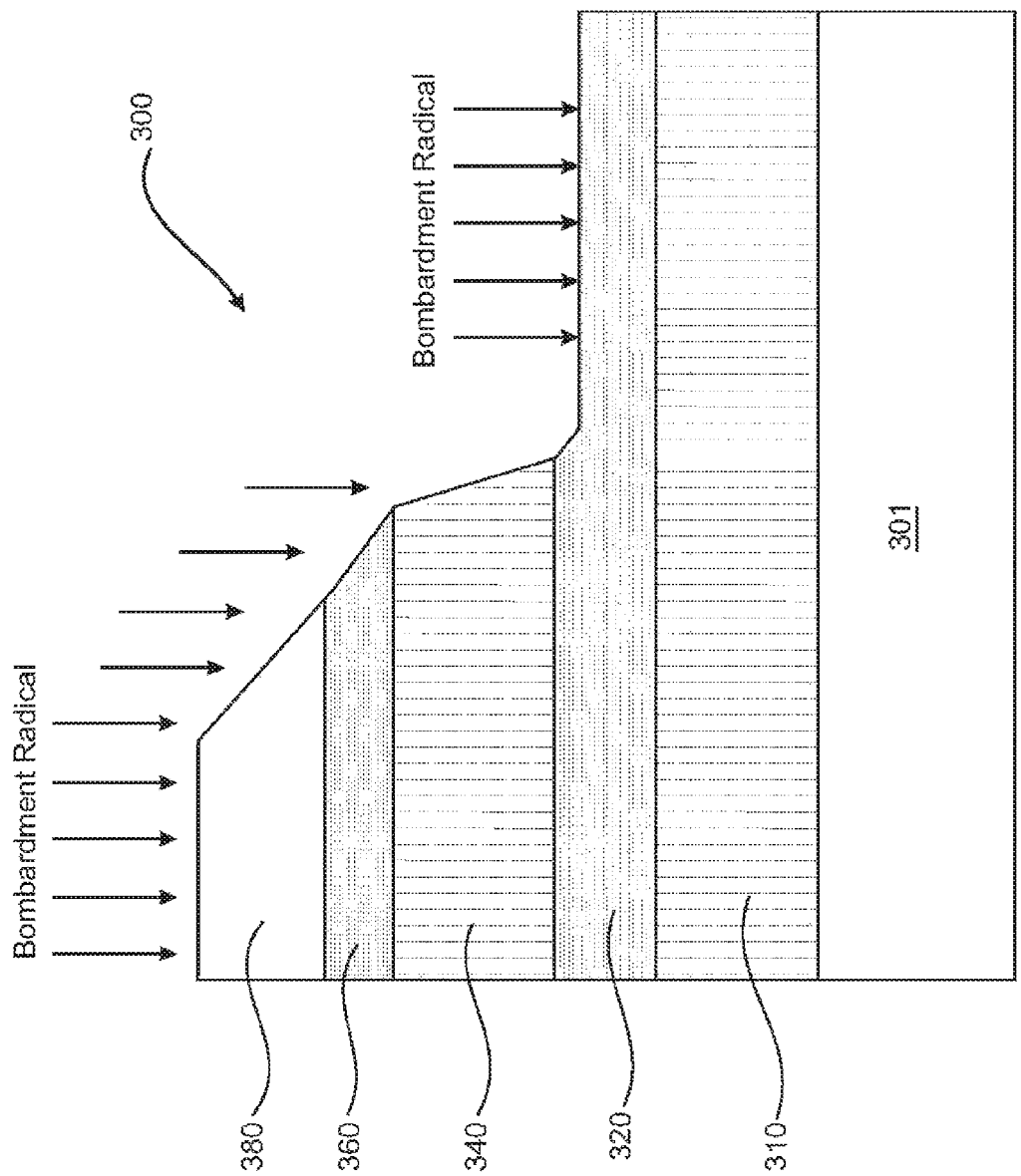

Referring now to FIG. 8, therein is shown the semiconductor structure 300 of FIG. 7 during a top electrode over-etch step. The top electrode over-etch step removes any exposed top electrode material still remaining after the main etch. In one embodiment, the over-etch step comprises a first chemistry that etches the top electrode material at a higher rate compared to the underlying capacitor dielectric layer 320 coupled with a bombardment component for simultaneously for further trimming the sidewall etch residues. The etch chemistry and process conditions for the top electrode main and over-etch step may be similar.

In FIG. 8, the top electrode over-etch step is an anisotropic plasma etch process and the trimming component comprises the incorporation of an additional bombardment efficient gas chemistry (e.g. Ar, $BCl_3$, $C_2H_4$, $N_2$, or combinations thereof) for high energy vertical bombardment of the sidewall etch residues. In an alternative embodiment (not shown), the top electrode over-etch step may be an isotropic plasma etch process where etching of residual top electrode material and trimming of the etch residue proceeds in a non-directional manner, that is, the etch residues 390 are trimmed both vertically and laterally. The isotropic process may use the same gas chemistry to perform the dual functions of etching residual top electrode material and trimming sidewall etch residues.

For the example shown in FIG. 8, the sidewall etch residues 390 are substantially removed by the over-etch step. In an alternative embodiment (not shown), the sidewall etch residues are not removed completely but sufficiently thinned down at a portion along the sidewalls 362 of the patterned top dielectric layer 360 so that when the masking layer is subsequently removed, a portion of the etch residue gets lifted off along with it. In this way, the extent of etch residue protrusion above the top surface of the patterned top electrode 340 is reduced.

In another embodiment, which is not described with respect to the accompanying drawings, the present invention may be applied to the patterning of a bottom electrode layer instead of a top electrode layer and the bottom electrode layer can be patterned in accordance with an overlying capacitor dielectric layer with outwardly tapered sidewalls.

Figure 9:
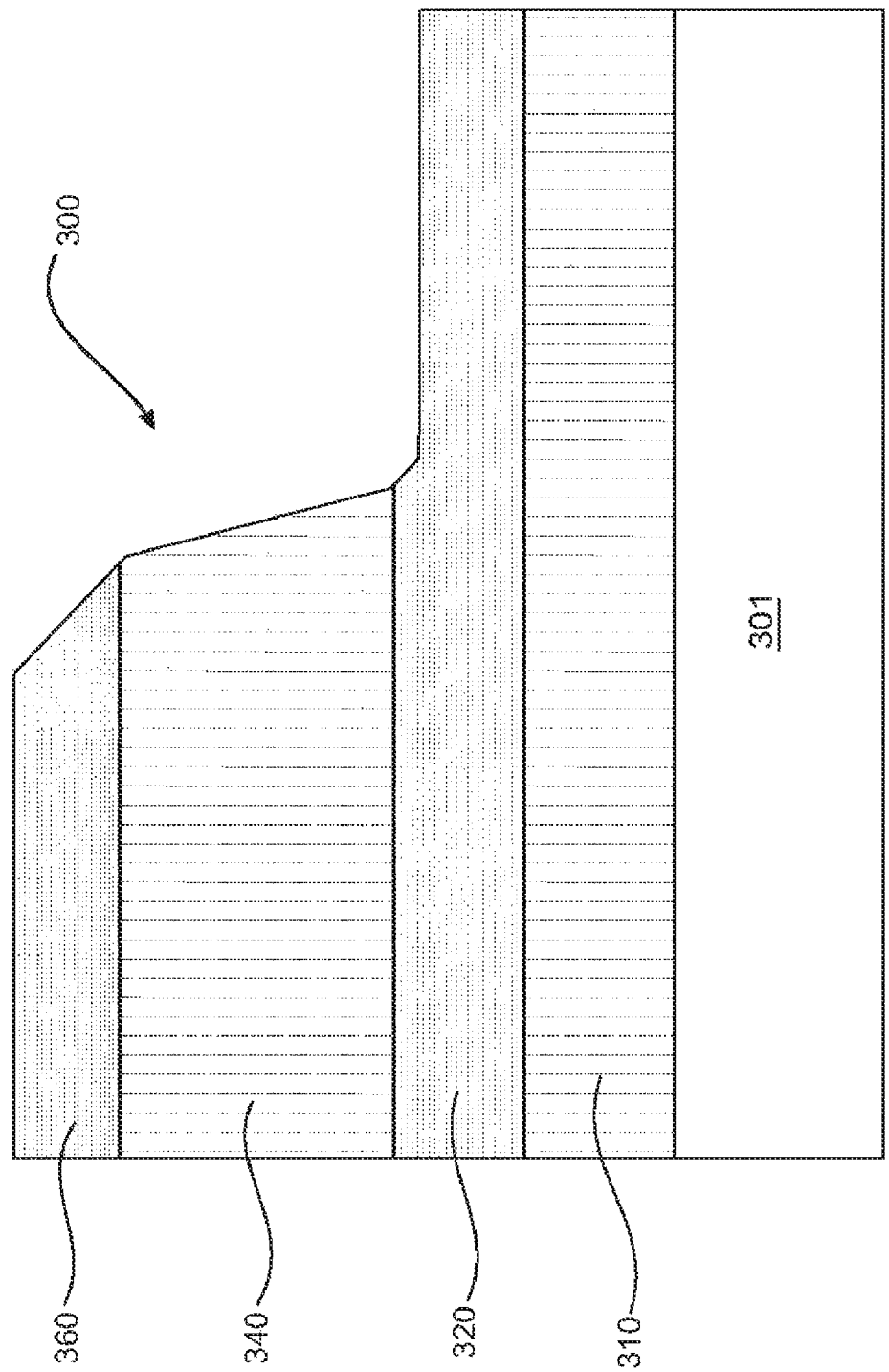

FIG. 9 shows the semiconductor structure of FIG. 8 after the completion of the over-etch step and subsequent removal of the masking layer 380. In one embodiment, the masking layer 380 is a photoresist material and it is removed by an oxygen containing plasma strip process. Preferably, the plasma strip process is carried out in-situ, that is, in the same process equipment as the preceding top dielectric and electrode etch steps. For instances where it is necessary to transport the wafers between chambers, this transfer is carried out without breaking vacuum.

The inventors have discovered that prolonged exposure to single oxygen containing chemistry (for example, $H_2O$ or $O_2$ or a combination thereof) tends to harden the photoresist 380 and any residual etch residue, thus making their removal difficult. Therefore, the plasma strip process is preferably made up of steps that alternate between different combinations of oxygen containing gases. In one embodiment, the plasma strip process includes a first etching recipe comprising $H_2O$ followed by a second etching recipe comprising $H_2O$, $O_2$ and $N_2$. Since oxygen is present in both $H_2O$ and $O_2$, these two components perform an ashing function. $N_2$, on the other hand, acts as a catalyst to facilitate the generation of O radicals, thus bringing about an increase in ashing rate. The first and second etching recipe may be alternated several times during the course of the plasma strip process. It is also possible to reverse the sequence described above and have the second recipe carried out first. The duration of each recipe step is determined based on factors such as time taken for the photoresist and/or polymer to harden and throughput considerations. In a preferred embodiment, microwave power is used in the plasma strip process.

The above embodiment for removing photoresist is not to be construed as limitative in its application. For example, although the description illustrates the invention as being applied to the removal of photoresist after top electrode etch, the invention is also relevant to the removal of photoresist after other plasma etching processes such as but not limited to metal, polysilicon or dielectric plasma etching processes.

Figure 10:
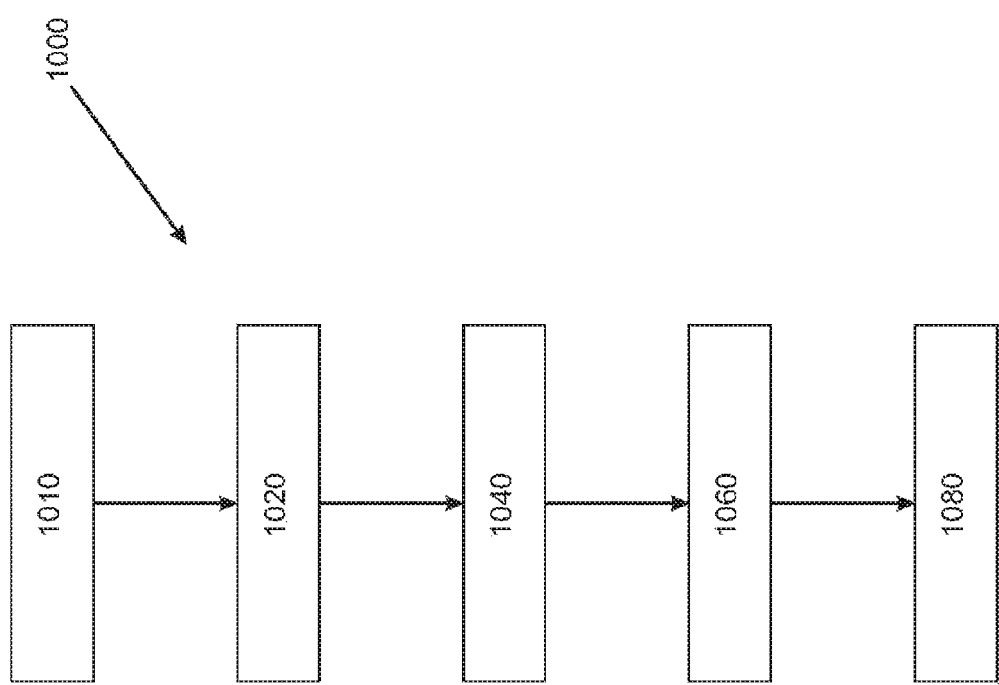
FIG. 10 is a flow chart of an integrated circuit system, for manufacturing a semiconductor device in accordance with an embodiment of the invention.

FIG. 10 is a flow chart 1000 illustrating a process for fabricating a semiconductor device in accordance with one embodiment of the invention. The process includes providing a substrate in block 1010; forming a first layer over the substrate and a second layer over the first layer in block 1020; forming a patterned masking layer over the second layer in block 1040; forming a patterned second layer with outwardly tapered sidewalls by isotropically etching exposed portions of the second layer in block 1060; and simultaneously etching the first layer in accordance with the patterned second layer and trimming etch residues deposited on the outwardly tapered sidewalls in block 1080, the outwardly tapered sidewalls having an angle that facilitates the trimming of etch residues deposited thereon.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

The invention claimed is:

1. A method for fabricating a semiconductor device comprising:
   forming a first device layer over a substrate and a second device layer over the first device layer;
   forming a patterned masking layer of photoresist material on the second device layer;
   forming a patterned second device layer, using the patterned masking layer of photoresist material, with second sidewalls that are outwardly tapered by isotropically etching portions of the second device layer;
   etching the first device layer in accordance with the patterned second device layer to form a patterned first device layer; and
   wherein etching the first device layer comprises a main etch step and an over-etch step, the main etch step being configured to simultaneously remove exposed portions of the first device layer to define a shape of the patterned first device layer and at the same time trim etch residues deposited on the tapered sidewalls of the patterned second device layer during the etching of the first device layer.

2. The method as claimed in claim 1, wherein prior to the etching of the first device layer, the sidewalls of the patterned second device layer are inclined at an angle of less than 80 degrees with respect to a top surface of the first device layer.

3. The method as claimed in claim 2, wherein prior to the etching of the first layer, the sidewalls of the patterned second layer are inclined at an angle of about 40 to 60 degrees with respect to a top surface of the first device layer.

4. The method as claimed in claim 1, wherein said simultaneously removing and trimming in the main etch step is by anisotropic plasma etching.

5. The method as claimed in claim 4, wherein the anisotropic plasma etching comprises using a first gas chemistry for removing the first device layer and a separate bombardment efficient gas chemistry for trimming the etch residues.

6. The method as claimed in claim 1, wherein said simultaneously removing and trimming in the main etch step is by isotropic plasma etching.

7. The method as claimed in claim 6, wherein the isotropic plasma etching comprises using a first gas chemistry both for removing the first device layer and trimming the etch residues.

8. The method as claimed in claim 1, wherein the patterned first device layer forms part of an electrode in a MIM capacitor.

9. The method as claimed in claim 8, wherein the patterned second device layer forms part of a capacitor dielectric or part of a diffusion barrier layer in the MIM capacitor.

10. The method as claimed in claim 1, further comprising removing the patterned masking layer by a plasma strip process comprising a first etching recipe and a second etching recipe, the first and second etching recipes comprising different combinations of oxygen containing gases.

11. The method as claimed in claim 10, wherein the patterned masking layer is removed after forming the patterned first device layer.

12. The method as claimed in claim 10, wherein one of the first or second etching recipe comprises $H_2O$ and the other etching recipe comprises $H_2O$, $O_2$ and $N_2$.

13. The method as claimed in claim 10, wherein the plasma strip process comprises alternating between the first and second etching recipe at least once.

14. The method as claimed in claim 1, wherein sidewalls of the patterned first and second device layers have a different angle of inclination.

15. The method as claimed in claim 1, further comprising removing the patterned masking layer after forming the patterned first device layer wherein etching the first device layer comprises trimming the etch residues so that a portion of the etch residue is capable of being lifted off by the removal of the patterned masking layer.

16. A method for fabricating a capacitor comprising
forming a first layer over a substrate;
forming a dielectric layer over the first layer;
forming a patterned masking layer of photoresist material on the dielectric layer;
isotropically etching the dielectric layer using solely the patterned masking layer of photoresist material to form a patterned dielectric layer with tapered sidewalls, by wherein the patterned dielectric layer functions as a capacitor dielectric or a diffusion barrier layer for the capacitor;
etching the first layer in accordance with the patterned dielectric layer to form a first electrode for the capacitor; and
wherein etching the first layer comprises a main etch step and an over-etch step, the main etch step being configured to simultaneously remove exposed portions of the first layer to define the shape of the first electrode and at the same time trim etch residues deposited on the tapered sidewalls of the patterned dielectric layer during the etching of the first layer.

17. The method as claimed in claim 16, wherein the sidewalls of the patterned dielectric layer and first electrode have a different angle of inclination.

18. The method as claimed in claim 16, wherein the ratio of sidewall etch residue removal rate to first electrode etch rate is 1:12~17.

* * * * *